United States Patent [19]
Anderson et al.

[11] Patent Number: 5,963,111
[45] Date of Patent: Oct. 5, 1999

[54] ORTHOGONAL TRANSITION FROM COAX TO STRIPLINE FOR OPPOSITE SIDES OF A STRIPLINE BOARD

[75] Inventors: Joseph M. Anderson; Pyong K. Park, both of Tucson, Ariz.

[73] Assignee: Raytheon Company, Lexington, Mass.

[21] Appl. No.: 09/058,106

[22] Filed: Apr. 9, 1998

[51] Int. Cl.[6] .................................. H01P 5/08; H01P 5/12
[52] U.S. Cl. .......................... 333/128; 333/136; 333/246; 333/260
[58] Field of Search .............................. 333/33, 238, 246, 333/260, 128, 136; 439/63, 581

[56] References Cited

U.S. PATENT DOCUMENTS 3,757,272  9/1973  Laramee et al. .................... 333/260 X
4,994,771  2/1991  Takamine et al. ....................... 333/33

*Primary Examiner*—Paul Gensler
*Attorney, Agent, or Firm*—David W. Collins; Andrew J. Rudd; Glenn H. Lenzen, Jr.

[57] ABSTRACT

Apparatus and methods for transitioning between opposite sides of adjacent stripline circuit boards. An orthogonal coaxial connection between opposite sides of the stripline circuit boards is provided wherein a center pin of a coax connector is disposed through the first stripline circuit board and the center trace of one of the stripline circuit boards and through the second board. The center pin is soldered or otherwise electrically attached to a small conductor island pad isolated from the ground plane of the second board and to the plated through hole. The ground of the coaxial connector is connected to the ground plane of the second board adjacent to the isolated conductor island pad.

10 Claims, 5 Drawing Sheets

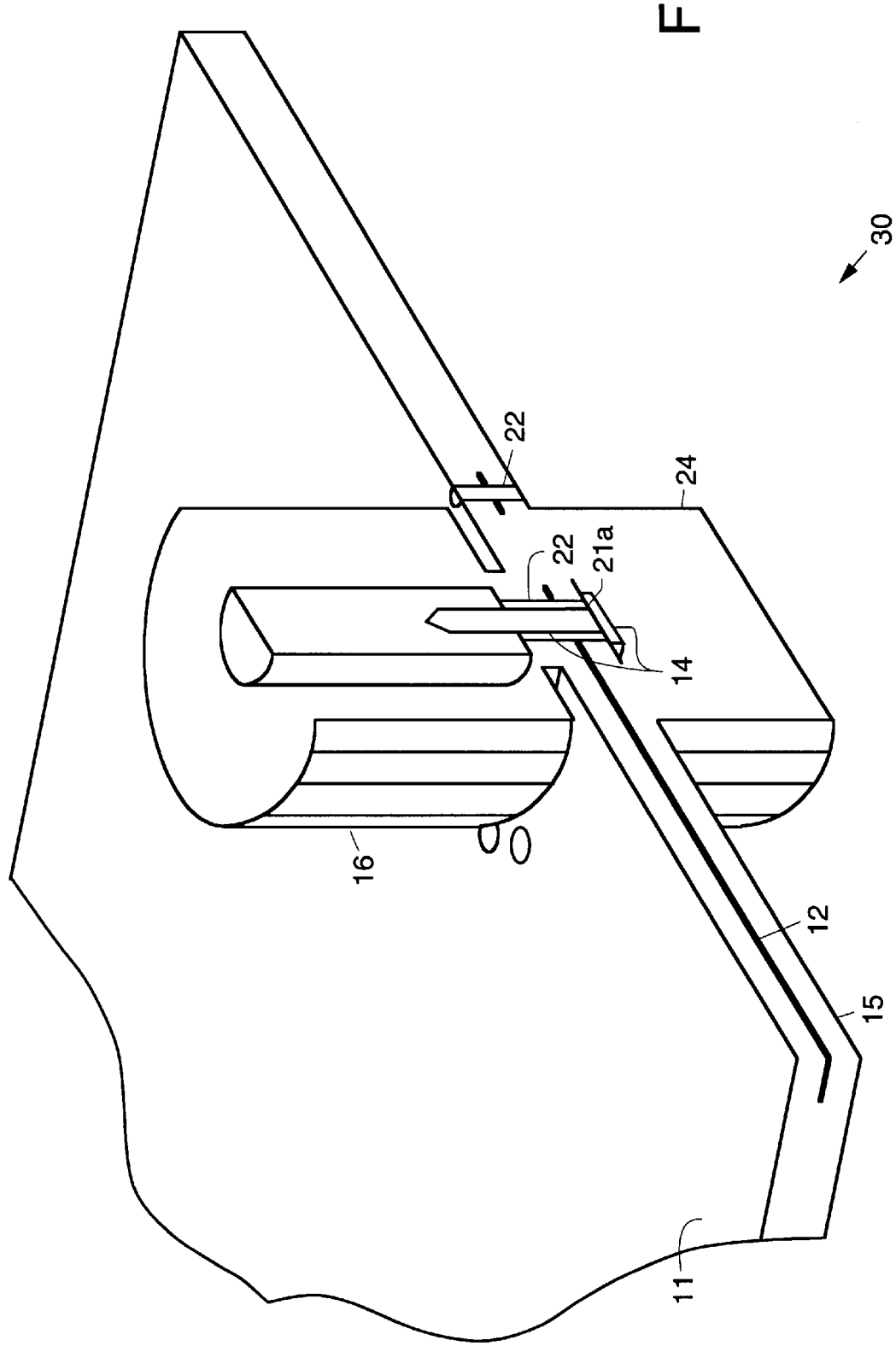

ORTHOGONAL TRANSITION FROM COAX TO STRIPLINE FOR OPPOSITE SIDES OF A STRIPLINE BOARD

BACKGROUND

The present invention relates generally to stripline to coaxial transitions, and more particularly, to an orthogonal stripline to coaxial transition between opposite sides of a stripline board.

Stripline to coaxial transitions are required quite often in radar seekers antennas. The antenna usually contains a hybrid of different transmission media such as waveguide and suspended air stripline, and stripline. Once the microwave energy is collected from the antenna it must be channeled to a receiver. It is this transition that must couple electromagnetic energy smoothly from the stripline medium to the coaxial medium with minimal energy loss.

The assignee of the present invention has developed a bonded stripline circuit for use in a radar seeker that requires electrical access to both sides of the circuit. It is desired that this access is achieved by means of an orthogonal coaxial connection. This can be achieved in a number of ways, however the existing state of the art has some disadvantages. Prior art coupling mechanisms employ techniques such as cutting and removing portions of the board which are labor intensive and time consuming, or use techniques that require detailed assembly.

One prior art orthogonal launch transition is fabricated such that center coax pins are first soldered to each conductor trace, and then two stripline boards are bonded together. This process is particularly difficult when orthogonal launch connections are required from both sides of the stripline boards. Movement of the pins during bonding is likely and damage to the pins is very likely. Using this approach it is very difficult to mechanically position the pins accurately, and the performance is sensitive to misalignment errors. This problem is enhanced when the diameter of the pin (i.e. the center conductor of the coax) is small, such is the case for the above-mentioned application where pin diameters are 15 thousandths of an inch.

Another prior art orthogonal launch transition is fabricated such that the stripline boards are first bonded, then the center pins are soldered. This solution requires the removal of a small portion of the stripline board below the conductive trace. The removed section must be large enough to accommodate the head of the pin and large enough to allow room to solder the head of the pin to the conductor trace. This approach is labor intensive and difficult since the removed section of the stripline board must be plugged after soldering. This also disrupts the mechanical and electrical integrity at the transition, since the plugs must be attached to the stripline board by means of conductive tape, for example. This makes RF performance difficult to repeat, especially at higher RF frequencies.

Accordingly, it is an objective of the present invention to provide for an improved orthogonal stripline to coaxial transition between opposite sides of a stripline board.

SUMMARY OF THE INVENTION

To accomplish the above and other objectives, the present invention provides for simple, straight forward, less labor intensive and inexpensive apparatus and methods for transitioning between opposite sides of a stripline board which uses orthogonal coaxial connections between opposite sides of the stripline circuit boards. Use of standard printed circuit board technology is maximized. The present invention provides for easier fabrication and assembly with excellent RF performance.

The present invention extends a center pin of a coax connector beyond the center trace of one stripline board through the second board. The center pin is soldered to a small conductor island pad isolated from a ground plane of the second board and to the plated through hole. This change greatly simplifies the manufacture and assembly of the transition and makes the cost of the transition less expensive than prior art transitions. The ground of the coaxial connector is connected to the ground plane of the second board adjacent to the isolated conductor island pad.

The present invention is simpler and reduces the labor and the number of processes evolved in making the transition. Some of the advantages of the present invention include the following. There is no need to remove a small portion of the circuit board to gain access to the center pin for soldering. The center pin can be soldered directly to the bottom portion of the stripline ground plane. Use of existing printed circuit board technology can be used to plate the center pin through hole. The circuit boards can be bonded without having the pins present. Maximum use is made of existing circuit board fabrication techniques. Larger bandwidth is realizable when thinner stripline boards are used.

The approach of the present invention may be used on many stripline RF circuits that require an orthogonal launch connection. The design will also provide for a single right angle transition. There is a significant cost reduction achieved using the present invention since there are fewer assembly steps and a reduced amount of touch labor.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which:

FIG. 5 illustrates a computer generated model of the present orthogonal launch transition.

DETAILED DESCRIPTION

Figure 1A:
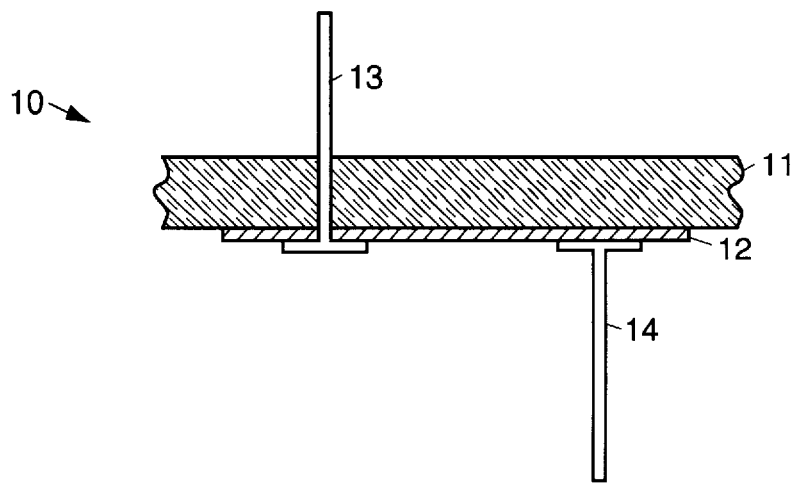
Figs. 1a–1c illustrate fabrication of a first conventional orthogonal launch transition.
Figure 1B:
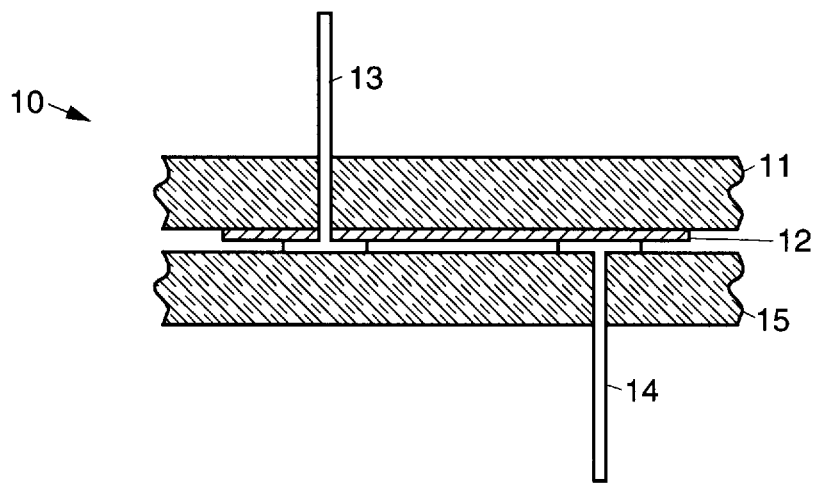
Figure 1C:
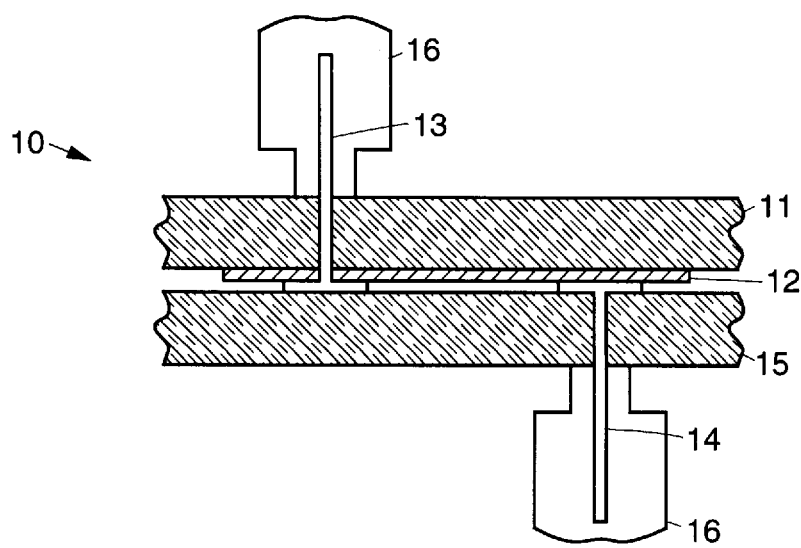

Referring to the drawing figures, FIGS. 1a–1c illustrate fabrication of a first conventional orthogonal launch transition 10. Referring to Fig. 1a, the first conventional orthogonal launch transition 10 is fabricated such that center coax pins 13, 14 are first soldered to a conductor trace 12 formed on a first stripline circuit board 11. Then, as shown in Fig. 1b, the first stripline board 11 and a second stripline board 15 are bonded together, sandwiching heads of the pins 13, 14 between them. As is shown in Fig. 1c, coax connectors 16 are coupled to the respective pins 13, 14 to complete the electrical circuit. This process is particularly difficult when orthogonal launch connections are required from both sides of the stripline boards 11, 15. Movement of the pins 13, 14 during bonding is likely and damage to the pins 13, 14 is very likely. Using this approach it is very difficult to mechanically position the pins 13, 14 accurately, and the performance of the transition 10 is sensitive to misalignment errors. This problem is enhanced when the diameter of the pins 13, 14 is small.

Figure 2A:
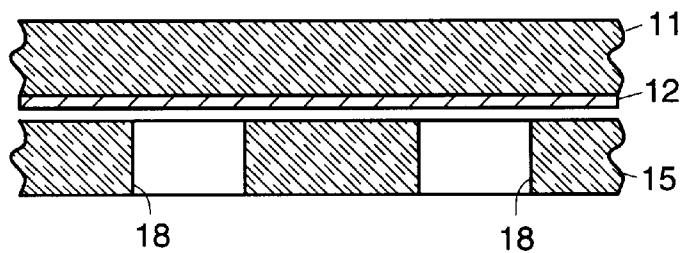
FIGS. 2a–2c illustrate fabrication of a second conventional orthogonal launch transition.
Figure 2B:
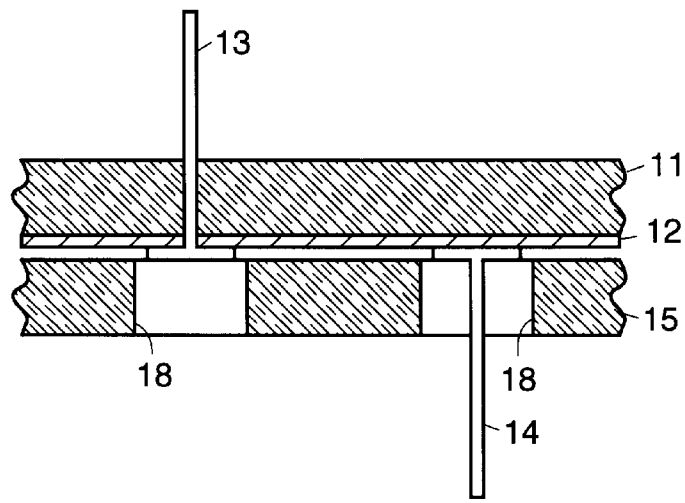
Figure 2C:
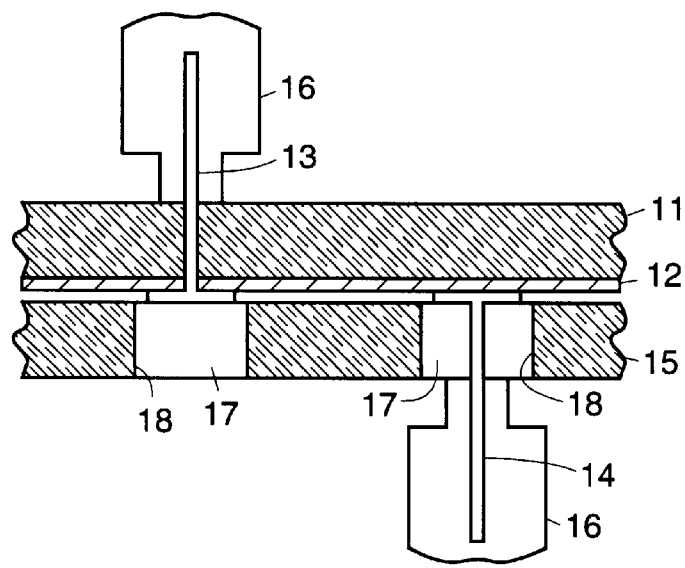

FIGS. 2a–2c illustrate fabrication of a second conventional orthogonal launch transition 20. Referring to FIG. 2a, the second conventional orthogonal launch transition is fabricated such that a first stripline board 11 having a conductive trace 12 on one side thereof is bonded to a second stripline board 15, sandwiching the conductive trace 12 between them. Sections of the second stripline board 15 are removed to form openings 18 therein at locations where center coax pins 13, 14 are to be soldered. Then, and referring to FIG. 2b, center pins 13, 14 are soldered to the conductive trace 12 that protrude above distal surfaces of the stripline boards 11, 15. This solution requires the removal of small sections 18 of the second stripline board 15 below the conductive trace 12. The removed sections 18 must be large enough to accommodate heads of the pins 13, 14 and large enough to allow room to solder the heads of the pins 13, 14 to the conductor trace 12. This approach is labor intensive and, as shown in FIG. 2c, difficult since the removed sections 18 of the second stripline board 15 must be filled with plugs 17 after soldering. This also disrupts the mechanical and electrical integrity at the transition 20, because the plugs 17 must be attached to the second stripline board 15 by means of conductive tape, for example. This makes RF performance difficult to repeat, especially at higher RF frequencies.

Figure 3A:
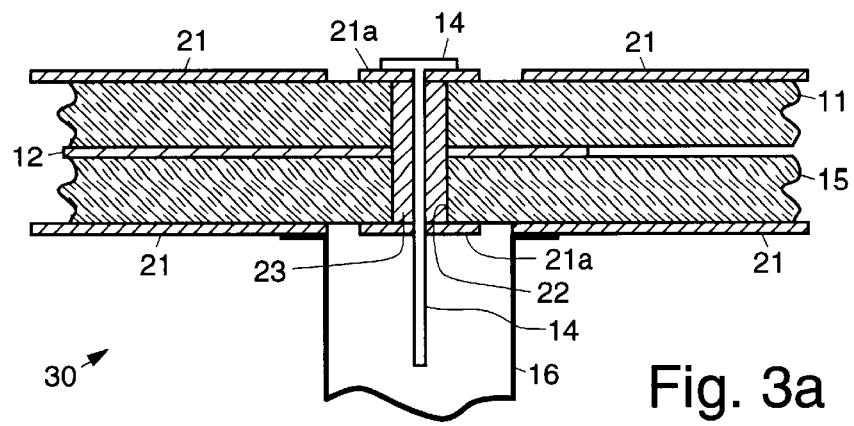
FIGS. 3a and 3b illustrate cross sectional side and perspective views of an orthogonal launch transition in accordance with the principles of the present invention.
Figure 3B:
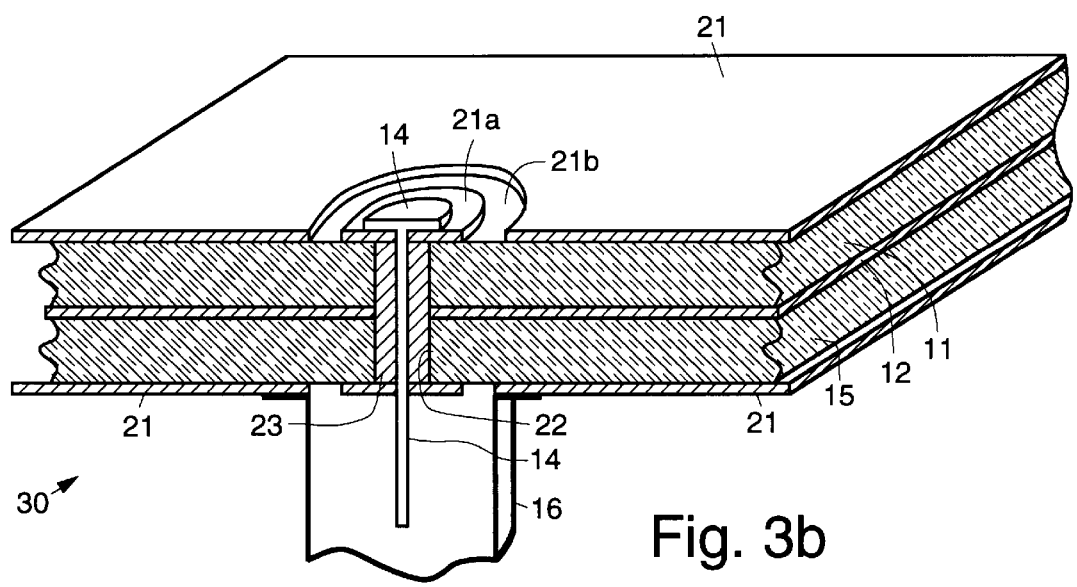

Referring now to FIGS. 3a and 3b, they illustrate cross sectional side and perspective views of an orthogonal launch transition 30 in accordance with the principles of the present invention. The present orthogonal launch transition 30 comprises a first stripline circuit board 11 having a conductive ground plane 21 formed on one surface and a conductive trace 12 formed on the other surface thereof. A second stripline circuit board 15 is provided that has a conductive ground plane formed on one surface thereof. The first and second stripline circuit boards 11, 15 are bonded together or otherwise attached so that the respective ground planes 21 face away from each other.

A through hole 22 is formed through the bonded stripline circuit boards 11, 15. A portion 216 of each of the respective ground planes 21 is removed by chemical etching, for example, to isolate the location of the through hole 22 from the ground planes 21. Removal of the portions of the ground planes 21 aids in impedance matching of the transition 30 because this reduces the reactance of the transition 30 and thus yields greater bandwidth. A portion 21a of the ground planes 21 (comprising a conductive pad 21a) remains at the location of the through hole 22 after chemical etching. The through hole 22 is plated to form a plated through hole 23 that is coupled through both of the stripline circuit boards 11, 15. A center pin 14 is disposed through the plated through hole 23 and attached to the respective conductive pads 21a and the plated though hole 23 by means of solder, for example. A coax connector 16 is then connected to the center pin 14 and to the adjacent ground plane 21.

Figure 4A:
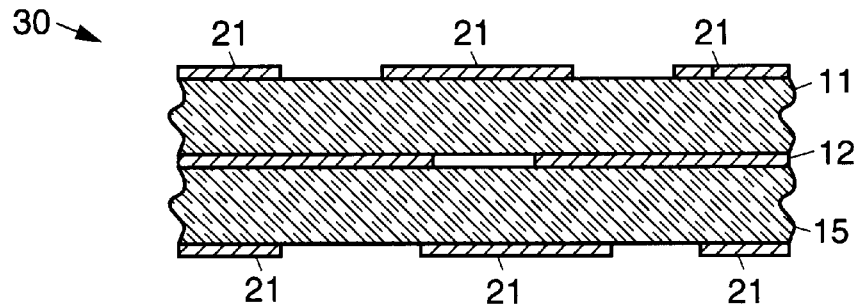
FIGS. 4a–4c illustrate fabrication of the present orthogonal launch transition.
Figure 4B:
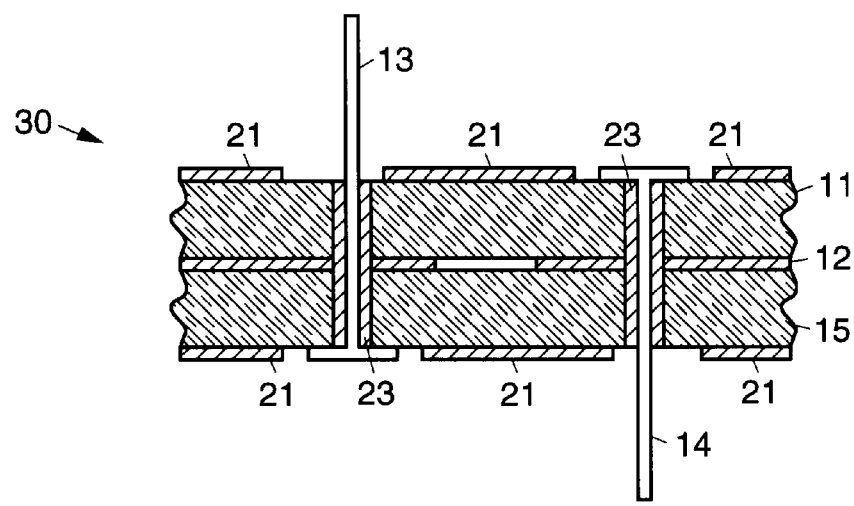
Figure 4C:
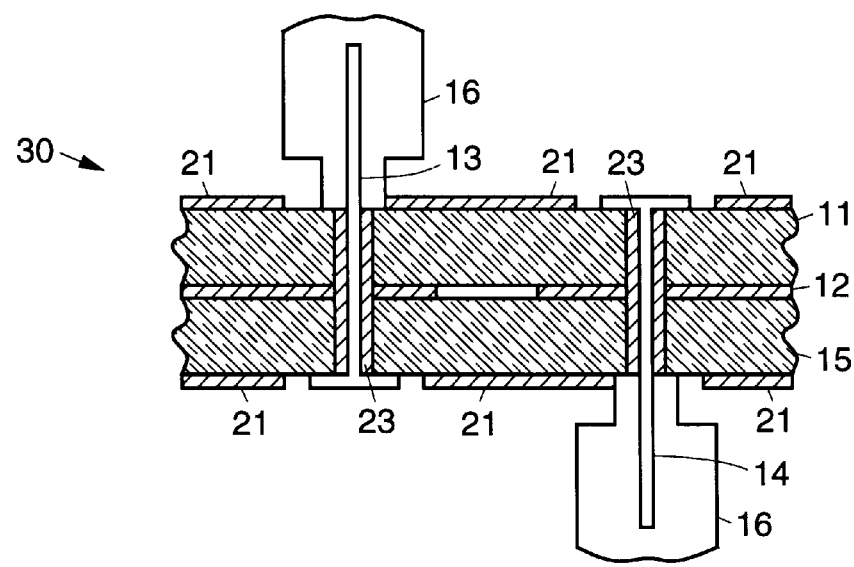

Referring now to FIGS. 4a–4c, they illustrate fabrication of the orthogonal launch transition 30. The assembly steps required to make the transition 30 are as follows. The first and second stripline circuit boards 11, 15 are bonded together. Plated through holes 23 are then formed through the bonded stripline circuit boards 11, 15. The center pins 14 are then attached to the stripline circuit boards 11, 15 and soldered to the plated through holes 23. The coax connectors 16 are connected to the center pins 16 and ground planes 21.

A commercially available finite element software tool known as HFSS (High Frequency Structure Simulator) available from Ansoft Corporation was used to model the transition 30. An HFSS model of an exemplary transition 30 is shown in FIG. 5. A dielectric plug 24 is used to add mechanical support for the head of the pin 14. The dielectric plug 24 is disposed in a countersunk hole (not shown) in a housing of the antenna (not shown).

Figure 6:
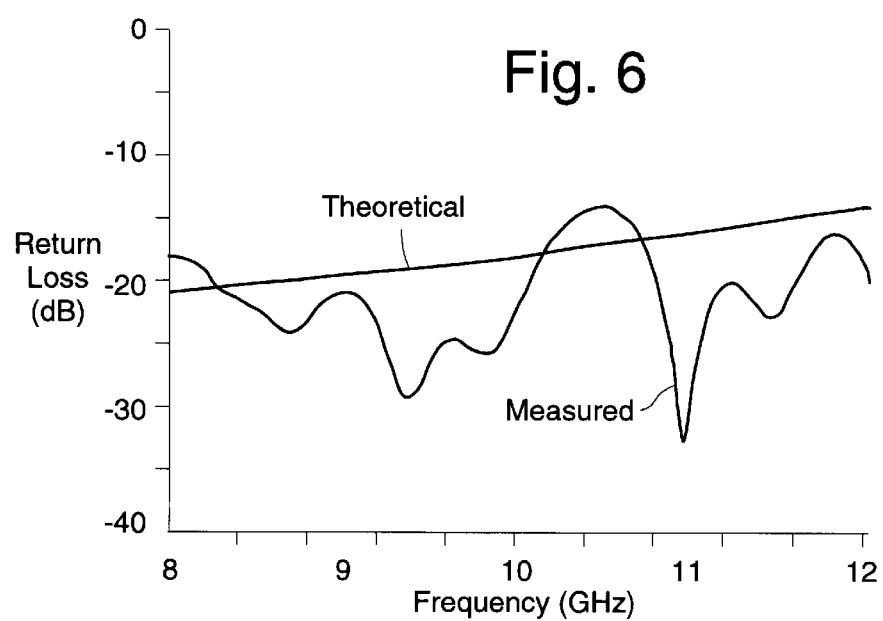
FIG. 6 is a graph illustrating the theoretical and measured return loss for the present orthogonal launch transition.

The measured and theoretical return loss for two back to back transitions 30 are shown in FIG. 6. An excellent input match is shown over a 40% bandwidth. As is shown in FIG. 6, the agreement between predicted and measured data is very good.

Thus, an improved orthogonal stripline to coaxial transition between opposite sides of a stripline board has been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. An orthogonal launch transition comprising:
   a first stripline circuit board having a conductive ground plane formed on a first surface and a conductive trace formed on a second surface;
   a second stripline circuit board having a conductive ground plane formed on one surface thereof, and wherein the first and second stripline circuit boards are attached so that the respective ground planes oppose and face away from each other;
   a plated through hole formed through the attached stripline circuit boards that is isolated from the respective ground planes;
   a center pin disposed through the plated through hole and electrically attached to the plated though hole and the conductive trace;
   a coax connector connected to the center pin and to an adjacent ground plane of a selected stripline circuit board.

2. The transition of claim 1 wherein the first and second stripline circuit boards are bonded together.

3. The transition of claim 1 further comprising a dielectric plug for supporting the center pin.

4. RF energy transitioning apparatus comprising:
   a first stripline circuit board having a conductive ground plane formed on a first surface and a conductive trace formed on a second surface;
   a second stripline circuit board having a conductive ground plane formed on one surface thereof, and wherein the first and second stripline circuit boards are attached so that the respective ground planes oppose and face away from each other;
   first and second plated through holes formed through the attached stripline circuit boards that are isolated from the respective ground planes;
   first and second center pin disposed through the plated through holes and electrically attached to the respective plated though holes and the conductive trace;
   first and second coax connectors connected to the center pins and to adjacent ground planes of the respective stripline circuit boards.

5. The apparatus of claim 4 wherein the first and second stripline circuit boards are bonded together.

6. The apparatus of claim 4 further comprising a dielectric plug for supporting the center pin.

7. A method of fabricating an orthogonal launch transition, said method comprising the steps of:

attaching a first stripline circuit board having a conductive ground plane formed on a first surface and a conductive trace formed on a second surface to a second stripline circuit board having a conductive ground plane formed on one surface thereof such that the respective ground planes of the first and second stripline circuit boards oppose and face away from each other;

forming a plated through hole through the attached stripline circuit boards;

electrically connecting a center pin to the conductive trace and the plated through hole; and connecting a coax connector to the center pin and a selected ground plane.

8. The method of claim 7 which further comprises the steps of:

forming a second plated through hole through the bonded stripline circuit boards;

electrically connecting a second center pin to the conductive trace and the second plated through hole; and connecting a second coax connector to the second center pin and a selected ground plane.

9. The method of claim 7 which wherein the attaching step comprises the step of bonding the first and second stripline circuit boards together.

10. The method of claim 7 which further comprises the step of disposing a dielectric plug adjacent to the center pin to provide support therefor.

* * * * *